United States Patent
Kilicaslan et al.

(10) Patent No.: US 7,432,728 B2
(45) Date of Patent: Oct. 7, 2008

(54) BLADE PROBE AND BLADE PROBE CARD

(75) Inventors: Habib Kilicaslan, Mesa, AZ (US);
David F. McDevitt, Tempe, AZ (US);
Bahadir Tunaboylu, Chandler, AZ
(US); David T. Beatson, Kennett Square,
PA (US)

(73) Assignee: SV Probe Pte Ltd., Singapore (SG)

( * ) Notice: Subject to any disclaimer, the term of this patent is extended or adjusted under 35 U.S.C. 154(b) by 0 days.

(21) Appl. No.: 11/711,319

(22) Filed: Feb. 26, 2007

(65) Prior Publication Data

US 2007/0210815 A1    Sep. 13, 2007

Related U.S. Application Data

(60) Provisional application No. 60/777,187, filed on Feb. 27, 2006.

(51) Int. Cl.
*G01R 31/02* (2006.01)
(52) U.S. Cl. .................................................. 324/754
(58) Field of Classification Search .......... 324/754–765
See application file for complete search history.

(56) References Cited

U.S. PATENT DOCUMENTS

| | | | |
|---|---|---|---|
| 4,791,363 A | | 12/1988 | Logan |
| 4,983,907 A | * | 1/1991 | Crowley ..................... 324/754 |
| 5,959,460 A | | 9/1999 | Johnson |
| 6,232,789 B1 | * | 5/2001 | Schwindt ..................... 324/754 |
| 6,603,322 B1 | * | 8/2003 | Boll et al. ..................... 324/754 |
| 6,781,396 B2 | * | 8/2004 | Schwindt ..................... 324/762 |
| 7,170,304 B2 | * | 1/2007 | Schaeffer et al. ............ 324/754 |

FOREIGN PATENT DOCUMENTS

WO    WO 98/26300    6/1998

OTHER PUBLICATIONS

European Patent Office, "Communication Relating to the Results of the Partial International Search", International Application No. PCT/US2007/005198, Sep. 21, 2007, 4 pages.

(Continued)

*Primary Examiner*—Ha Nguyen
*Assistant Examiner*—Joshua Benitez
(74) *Attorney, Agent, or Firm*—Hickman Palermo Truong & Becker LLP; Edward A. Becker

(57) ABSTRACT

A blade probe card includes a plurality of blades that each includes a first end connected to a printed circuit board and a second end. A probe member is attached to the second end of each blade and extends outward to make contact with a device under test. A ground member is attached to the second end of each blade. The blade probe card also includes a common ground member that is separate from the printed circuit board and coupled to the ground member of each blade. Each blade may also include a first conductive signal trace and two or more conductive ground traces formed on a surface of each blade. The first conductive signal trace electrically connects the probe member to a contact on the printed circuit board. The two or more conductive ground traces are adjacent to the conductive signal trace and reduce crosstalk between the blades.

17 Claims, 8 Drawing Sheets

OTHER PUBLICATIONS

Claims, International Application No. PCT/US2007/005198, 4 pages.
International Searching Authority, "Notification of Transmittal of the International Search Report and the Written Opinion of the International Searching Authority, or the Declaration", PCT/US2007/005198, received Nov. 26, 2007, 16 pages.
Claims, PCT/US2007/005198, 4 pages.

* cited by examiner

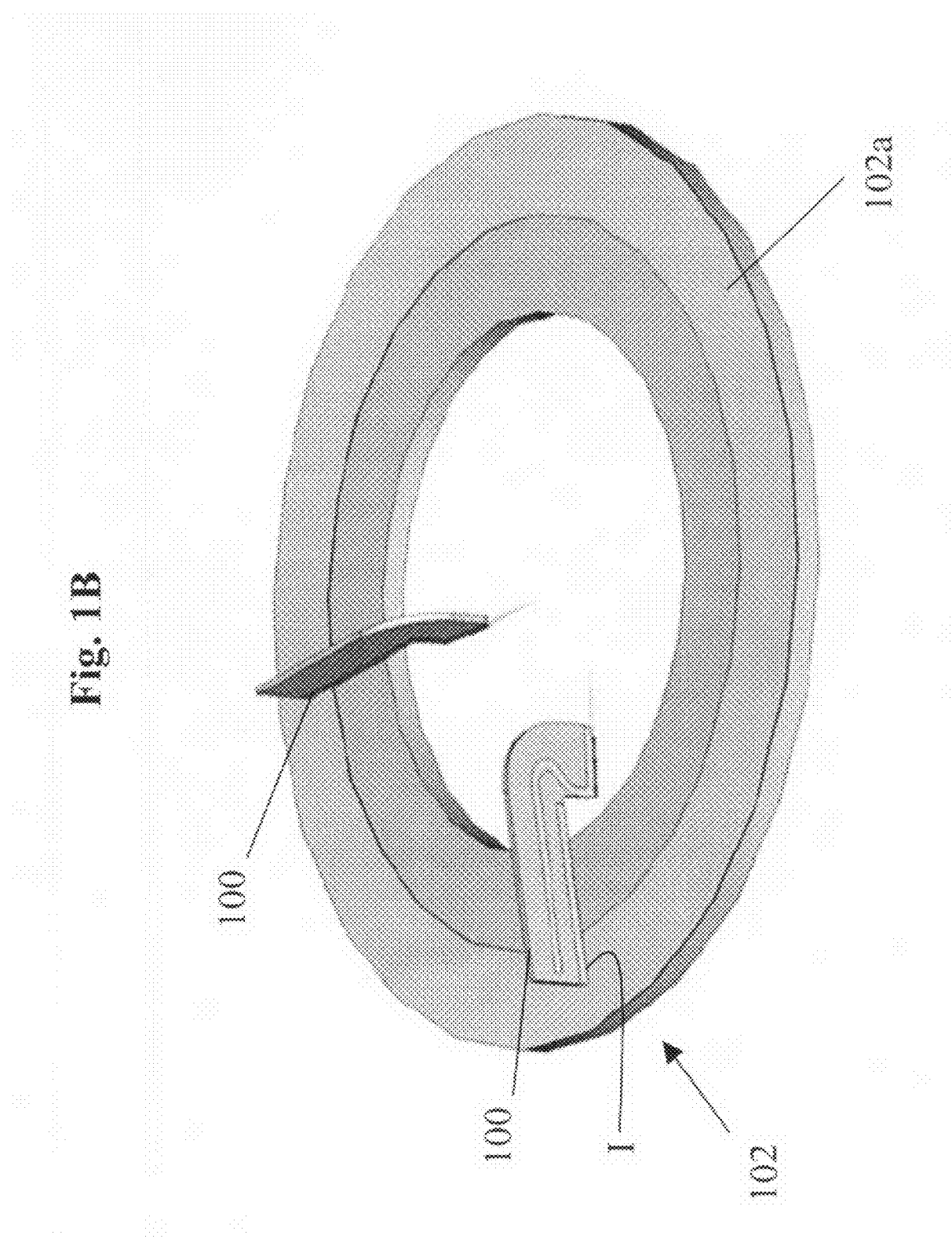

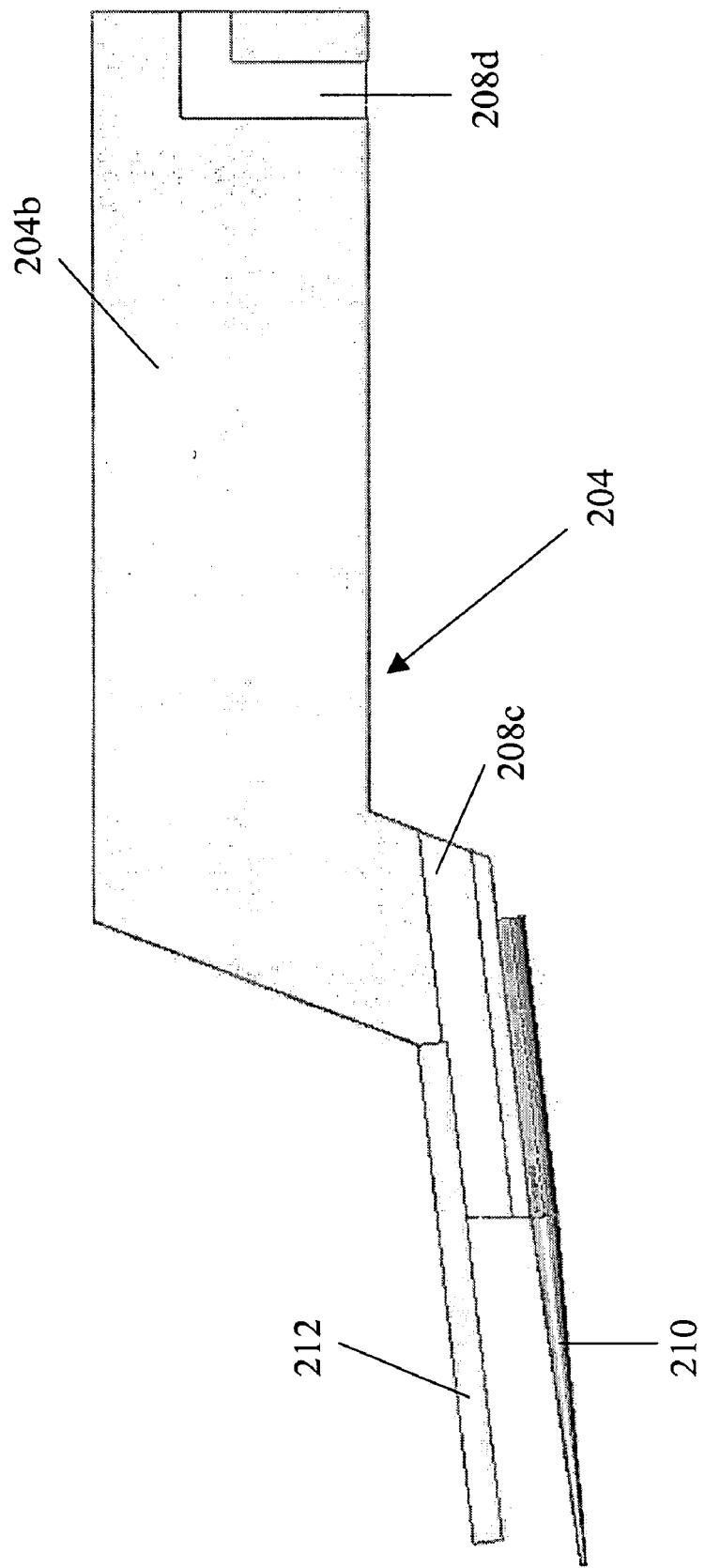

| ANGLE | BANDWIDTH @ -1 dB (GHz) | BANDWIDTH @ -3 dB (GHz) | RETURN LOSS @ -15 dB (GHz) |
|---|---|---|---|
| 7.5 | 16.57 | 26.68 | 7.13 |
| 90 | 3.3 | 6.35 | 1.18 |
| 180 | 2.45 | 4.62 | 0.88 |

Fig. 3

| ANGLE | BANDWIDTH @ -1 dB (GHz) | BANDWIDTH @ -3 dB (GHz) | RETURN LOSS @ -5 dB (GHz) |
|---|---|---|---|
| 90 | 20.9 | 34.5 | 8.8 |

Fig. 4

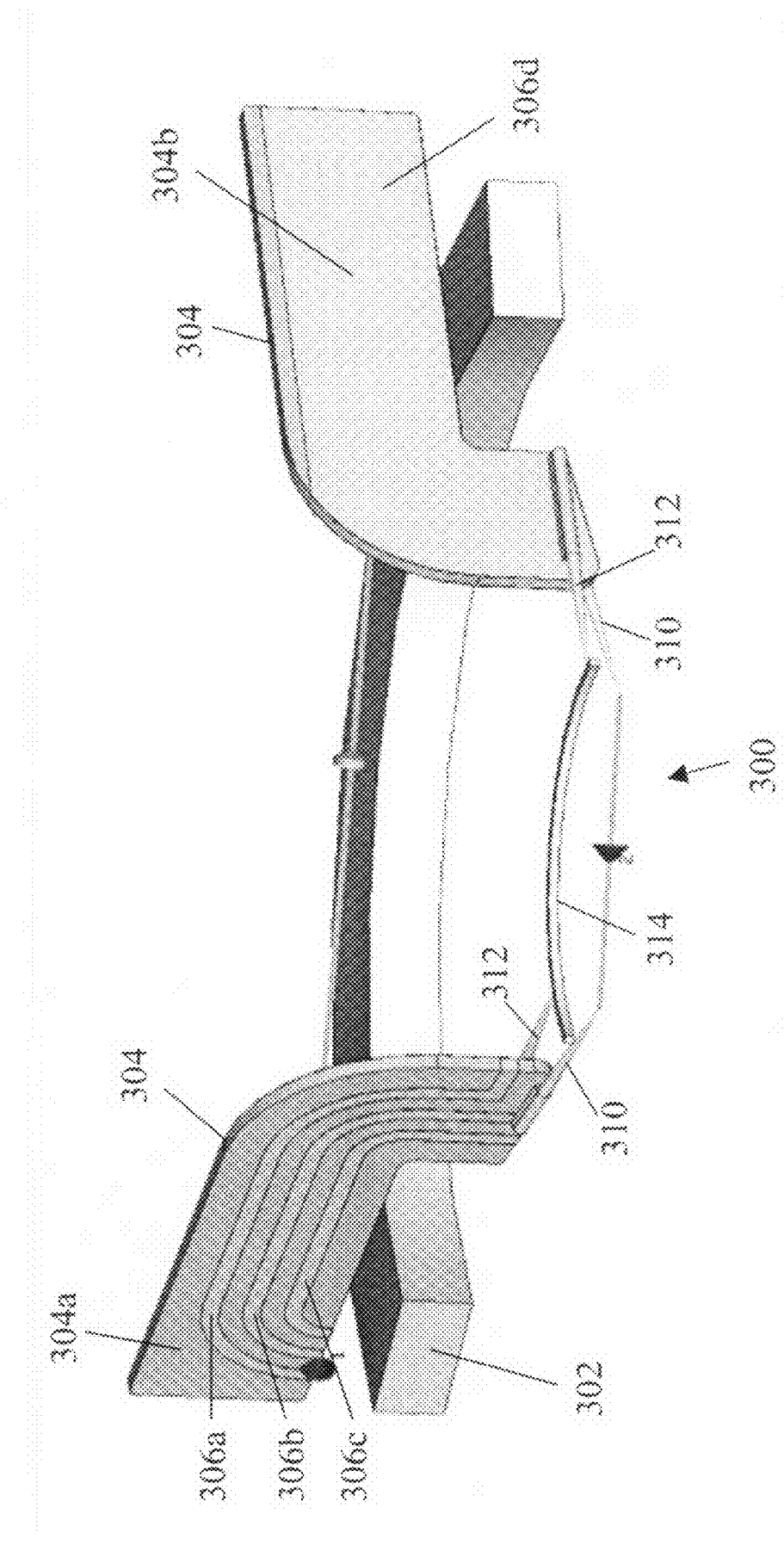

BLADE PROBE AND BLADE PROBE CARD

RELATED APPLICATION DATA AND CLAIM OF PRIORITY

This application claims the benefit of, and priority to, U.S. Provisional Patent Application No. 60/777,187, entitled PLATING OF PROBE ELEMENTS ON A REUSABLE SUBSTRATE, filed Feb. 27, 2006, the contents of which are incorporated by reference for all purposes as if fully set forth herein.

FIELD OF THE INVENTION

This invention relates generally to blade probes and blade probe cards used in the testing of wafer-based semiconductor devices.

BACKGROUND

In the testing of wafer based semiconductor devices, probe cards are typically used to provide electrical interconnection between a testing system and the semiconductor wafer. An exemplary type of probe card often used in high speed applications is a blade probe card. In such probe cards, "blades" (which are typically coupled to, and supported by, a printed circuit board) carry signal and ground paths.

FIG. 1A depicts a conventional blade 100, and FIG. 1B depicts two blades 100 connected to printed circuit board 102. Referring specifically to FIG. 1A, blade 100 comprises a ceramic material, e.g., 96% alumina, with a microstripline on surface 100a. More specifically, signal path 100c and ground path 100b are provided on surface 100a. Ground path 100b is electrically connected to ground plane 102a at interface "I." Signal path 100c is electrically connected, e.g., soldered, to probe needle 100d. Probe needle 100d is configured to probe a contact pad of a semiconductor device during testing thereof. For example, probe needle 100d may comprise tungsten, beryllium copper, or paliney 7.

As depicted in FIG. 1B, a plurality of blades 100 are placed on PCB in circular form. For purposes of explanation, only two blades 100 are depicted in FIG. 1B, but the approach is applicable to probe cards having any number of blades.

The bandwidth of such a system may be explained based on a complete closed circuit, and as such, the bandwidth of one single blade is not relevant in a practical application. As a result, three different angles, e.g., 7.5 degrees, 90 degrees, and 180 degrees, between the blades are simulated for existing structure of FIGS. 1A-1B. It is apparent that different angles will have different electric and magnetic field patterns that will result in different bandwidths. As expected, the 180 degree configuration has the lowest bandwidth and the case when the signal is closest to the ground (the 7.5 degree configuration) will have the widest bandwidth. FIG. 3 depicts a table that summarizes the results for a conventional blade card in the 7.5 degree, 90 degree, and 180 degree configuration with a conventional blade supplying the ground. As depicted in FIG. 3, with 90 degrees between the blades, the bandwidth at −1 dB is 3.3 GHz.

BRIEF DESCRIPTION OF THE DRAWINGS

In the figures of the accompanying drawings like reference numerals refer to similar elements.

FIG. 1B depicts two conventional blades connected to a printed circuit board.

FIGS. 2A-2C depict blades (and a blade probe card) configured according to an embodiment of the invention.

FIG. 3 depicts a table that summarizes the results for a conventional blade card in the 7.5 degree, 90 degree, and 180 degree configuration with a conventional blade supplying the ground.

FIG. 4 depicts a table that includes data for two blades similar to those depicted in FIGS. 2A-2C separated by 90 degrees.

FIG. 6 depicts a portion of a blade probe card including a printed circuit board and a plurality of blades configured according to one embodiment of the invention.

DETAILED DESCRIPTION

Figure 1A:
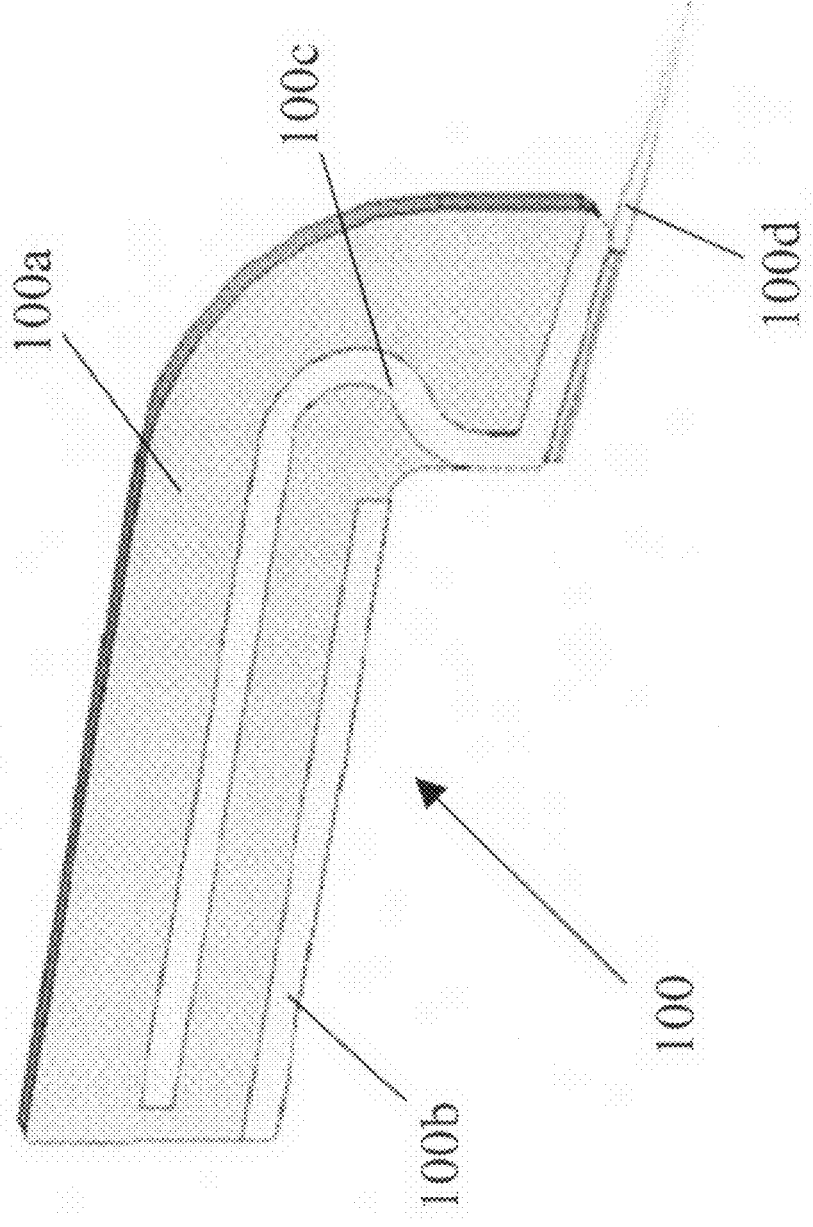
FIG. 1A depicts a conventional blade connected to printed circuit board.
Figure 2A:
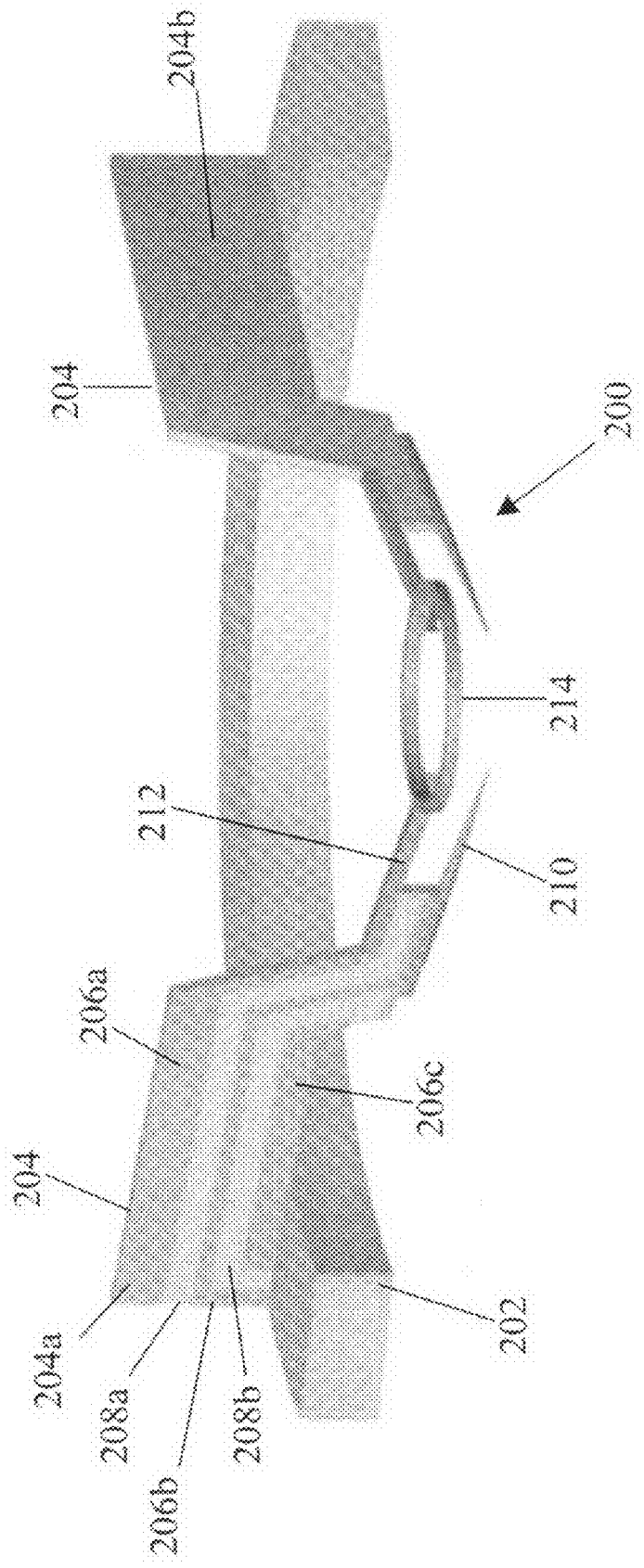
Figure 2B:
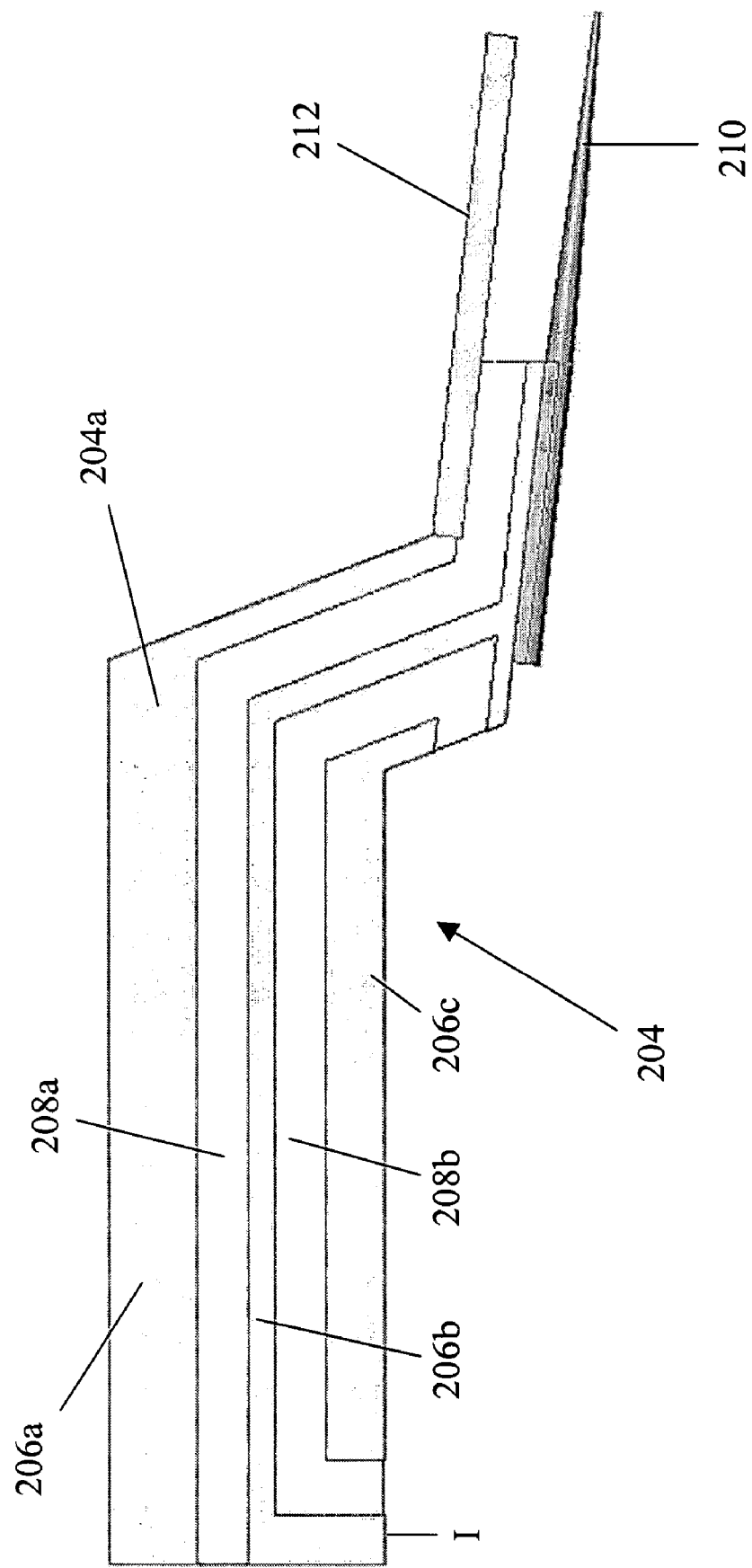

FIGS. 2A-2C depict blades (and a blade probe card) configured according to an embodiment of the invention. FIG. 2A depicts a portion of probe card 200 including PCB 202 and two blades 204 separated by 90 degrees. Blade 204 includes surface 204a and 204b, and comprises, for example, a ceramic material, e.g., an alumina-based material. As described in more detail hereinafter, a coplanar wave guide, having the signal trace surrounded by impedance matched ground traces, is defined for blade 204.

More specifically, blade 204 includes conductive traces 206a, 206b, and 206c that are formed on surface 204a. Conductive traces 206a, 206b, and 206c are separated electrically by portions of ceramic, i.e., clear portions 208a and 208b. All, or substantially all, of surface 204b may be covered with the same conductive material. Alternatively, different conductive materials may be used.

Conductive traces 206a, 206b, and 206c may be formed, and separated from one another, by an additive process, e.g., plating the traces on the ceramic material, or a subtractive process, e.g., removing portions of a conductive layer covering the surface 204a. Conductive traces 206a and 206c are ground traces, and conductive trace 206b is a signal trace which is electrically connected, e.g., soldered or brazed, to probe needle 210. Conductive trace 206a is electrically connected to ground member 212.

FIGS. 2B and 2C depict details of blade 204. For example, FIG. 2B depicts the connection between probe needle 210 and conductive trace 206b. FIG. 2B also depicts the interface "I" portion of conductive trace 206b which is configured to be electrically connected to an appropriate area of PCB 202 (See FIG. 2A). Further, FIG. 2C depicts the connection between ground member 212 and the majority conductive material on surface 204b, as well as non-conductive portions, i.e., 208c and 208d, of surface 204b, e.g., portions 208c and 208d are not covered by a conductive material in contrast to the rest of surface 204b. According to one embodiment of the invention, the ground member 212 is substantially parallel to probe needle 210, as depicted in FIGS. 2A-2C.

In contrast to the data provided for the conventional blades in the table depicted in FIG. 3, FIG. 4 depicts a table that includes data for two blades similar to those depicted in FIGS. 2A-2C separated by 90 degrees. Compared to a conventional bandwidth result of 3.3 GHz at −1 dB, a bandwidth of 20.9

GHz at −1 dB has been achieved using a blade probe card configured in accordance with an embodiment of the invention.

Figure 5:
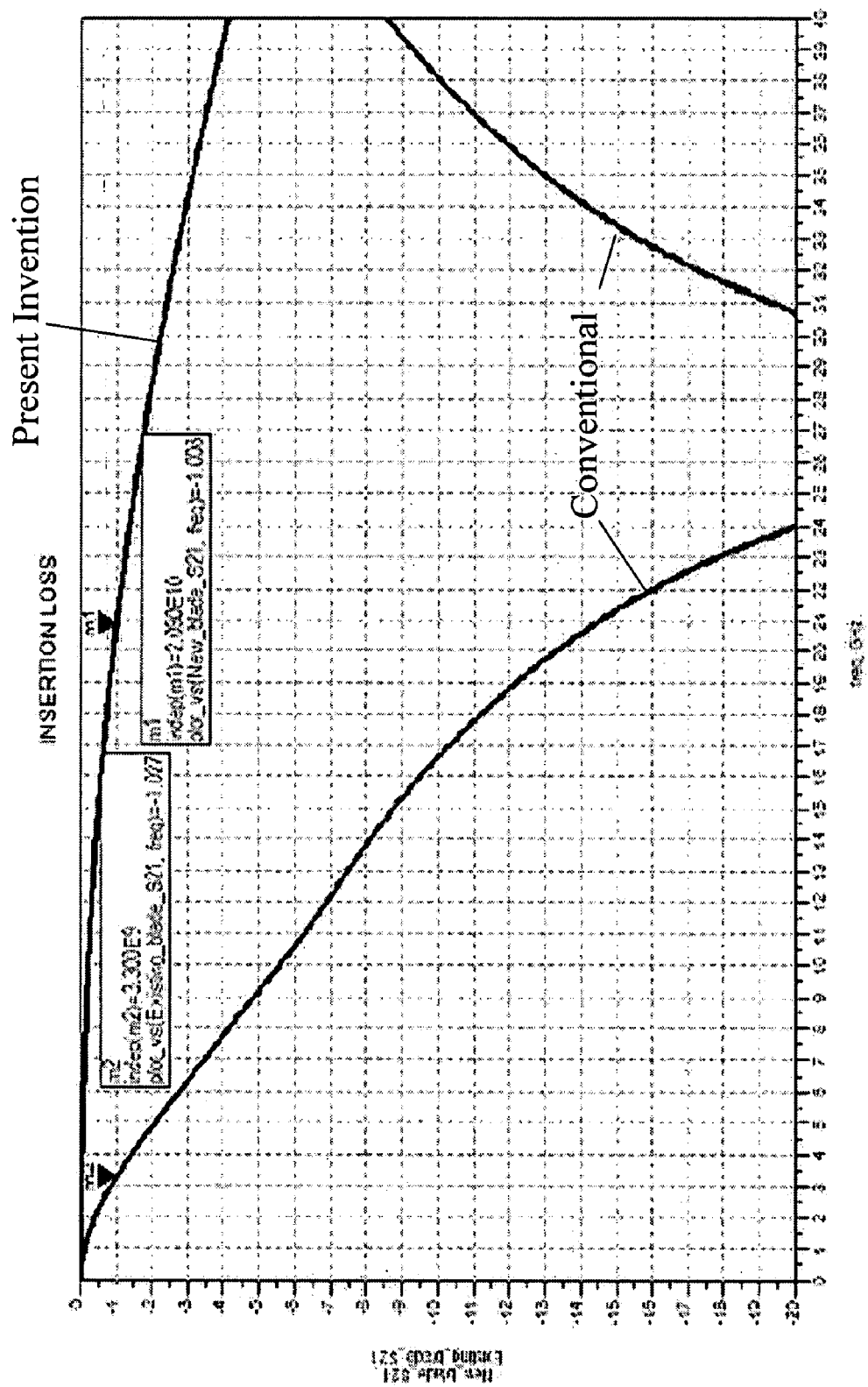
FIG. 5 is a graph that depicts the performance, with the frequency (in GHz) on the X-axis versus at various dB values on the Y-axis, of a conventional blade card and a blade card configured in accordance with an embodiment of the invention.

FIG. 5 is a graph that depicts the performance, with the frequency (in GHz) on the X-axis versus at various dB values on the Y-axis, of a conventional blade card and a blade card configured in accordance with an embodiment of the invention. The conventional blade card measurements are depicted in the graph marked "Conventional" which includes the data point previously recited at m2 (3.3 GHz at −1 dB), and the blade measurements for a blade card configured in accordance with an embodiment of the invention are marked "Present Invention" and includes the data point previously recited at m1 (20.9 GHz at −1 dB).

A similar result to that described above, e.g., a coplanar wave guide configuration with improved bandwidth, may be achieved by various different configurations of the conductive traces and the probe needles. For example, FIG. 6 depicts a portion of probe card 300 including PCB 302 and a plurality of blades 304 configured according to one embodiment of the invention. Blade 304 includes surfaces 304a and 304b. In this configuration, probe needles 310 and ground members 312 are provided on opposite sides of the blade, as opposed to in substantial vertical alignment (as in FIG. 2A). Conductive traces 306a, 306b, and 306c are provided on surface 304a, while substantially all of surface 304b is covered with conductive material 306d. Conductive traces 306a and 306c are ground traces, and conductive trace 306b is a signal trace. Signal trace 306b is electrically coupled to probe needle 310, and ground conductive material 306d is electrically connected to ground member 312. Ground member 312 is electrically connected to ground ring 314. As with the other embodiments of the invention depicted herein, not all of the conductive connections, e.g., the connection between ground traces 306a and 306c to the rest of the ground system) are depicted in the figures. As depicted in FIG. 6, end portions of ground members 312 are raised in relation to corresponding probe needles 310, facilitating contact with ground ring 314.

According to one embodiment of the invention, a blade may be modified to short a signal probe, e.g., probe needle 310, and a raised ground probe, e.g., ground member 312. The signal probe may then be used to apply ground from the PCB to the DUT's ground pad and short ground to the ground ring. This raised ground ring provides a much shorter path for the return current and enables a further increase in bandwidth.

According to the invention, improvements in the bandwidth may be provided (at least in part) because of the reduced ground path. That is, the ground path loop goes through the ground ring, or other appropriate ground structure, as opposed to conventional blade probe cards, where the ground loop runs from one blade to the next. More specifically, in conventional blade probe cards, the ground loop tends to pass through the PCB structure so the electrical fields and magnetic fields are radiated all over the board. According to the one embodiment of the invention, the ground loop length is reduced by using a ground member, e.g., ground member 212 depicted in FIG. 2A, between the blade and a ground ring. Thus, the injected signal passes through the IC being tested, and from the ground probe and shorted to the ground member. This reduces the ground loop length and the amount of energy that is radiated, thus providing for higher bandwidth and less impedance variations.

The ground member may have a "U" shape such that it may rest on top of the blade for ease of installation. The ground member may be mechanically bonded to both the blade and the ground ring, and in certain exemplary embodiments of the present invention, the ground member may be integrated as part of the blade or the ground ring, e.g., unitary with the blade or the ground ring.

As provided herein, according to one embodiment of the invention, high frequency traces are changed to a coplanar wave guide configuration (as opposed to a microstripline configuration), where the coplanar waveguide configuration provides less dielectric loss compared to microstripline configuration, and reduced crosstalk between probes.

When optimizing a probe card using impedance matching, additional desirable results may include, without limitation, (a) reduced probe needle length, and (b) reduced probe height, where the reduced length and height tend to result in less dielectric and conductor losses.

In contrast to conventional blade cards having large bandwidth variation for different angles, e.g., 2-16 GHz, blade probe cards according to the present invention have less bandwidth variation, e.g., ~1 GHz, and are substantially independent from assembly angle for two blades.

According to one embodiment of the invention, the achieved bandwidth also depends on the circular loop size (or other structure not necessarily a circular loop), which may be defined by the die size being tested. For example, rather than a circular wire loop, a full plane conductor (or any other shape) may be used if practical in a given configuration.

As depicted herein and described above, according to one embodiment of the invention, a coplanar waveguide configuration is utilized rather than a conventional microstripline configuration. The coplanar waveguide configuration may be used separate from or in combination with the depicted ground ring. According to another embodiment of the invention, a ground ring (or other appropriate structure) may be used with either a coplanar wave guide as described herein, or with a microstripline configuration. In the embodiments depicted in FIGS. 2A and 6, both of these features, e.g., a coplanar waveguide configuration and the ground ring, are provided.

Thus, according to one embodiment of the invention, a strip line configuration blade is configured with a ground member coupled to another ground structure, e.g., a ground ring, in order to minimize deviations from a desired characteristic impedance, e.g., 50 ohm, all the way to the probe tip.

According to certain exemplary embodiments of the present invention, a coplanar wave guide configuration blade is provided without the ground member and ground ring. This provides a reduction in crosstalk between adjacent blades. In such a configuration, a ground pad may be provided adjacent the signal pad on the PCB (as there is no ground ring/member).

While embodiments of the invention have been described primarily with reference to conductive traces deposited, e.g., plated, on ceramic blade probes, the invention is not limited to these examples. For example, the approach may be implemented using blades marketed by Rogers Corporation of Chandler, Ariz. For example, Rogers Corporation markets a RO4000 series hi-freq circuit material that may be machined or otherwise configured to define a coplanar waveguide.

Although the blade probe card is depicted and described herein with reference to specific embodiments, the invention is not intended to be limited to the details depicted. Rather, various modifications may be made in the details within the scope and range of equivalents of the claims and without departing from the invention.

What is claimed is:

1. A blade probe card comprising:
   a plurality of blades, wherein each blade from the plurality of blades includes:

a first end connected to a printed circuit board,
a second end,
a probe member attached to the second end and extending therefrom, wherein the probe member is configured to make contact with a device under test, and
a ground member attached to the second end and extending therefrom; and
a common ground member that is separate from the printed circuit board and coupled to the ground member of each blade from the plurality of blades.

2. The blade probe card as recited in claim 1, wherein for each blade from the plurality of blades, the probe member and the ground member are substantially parallel to each other.

3. The blade probe card as recited in claim 1, wherein for each blade from the plurality of blades includes a top edge and a bottom edge and the probe member and the ground member are mounted to the top edge and the bottom edge.

4. The blade probe card as recited in claim 3, wherein for each blade from the plurality of blades, the probe member and the ground member are substantially parallel to each other.

5. The blade probe card as recited in claim 3, wherein for each blade from the plurality of blades, the probe member and the ground member are in substantial vertical alignment to each other.

6. The blade probe card as recited in claim 1, wherein for each blade from the plurality of blades, the probe member and the ground member are mounted on opposite sides of the blade.

7. The blade probe card as recited in claim 6, wherein for each blade from the plurality of blades, the probe member and the ground member are mounted on opposite sides of the blade at different angles to allow the probe member to contact the device under test and to allow the ground member to contact the common ground member.

8. The blade probe card as recited in claim 1, wherein the common ground member is a ground ring.

9. The blade probe card as recited in claim 1, wherein the common ground member is a ground plane.

10. The blade probe card as recited in claim 1, wherein for each blade from the plurality of blades, the blade includes a top edge and a bottom edge, the ground member includes a u-shaped edge for mounting to the top edge and the probe member is mounted to the bottom edge.

11. The blade probe card as recited in claim 1, wherein for each blade from the plurality of blades, the probe member is attached to the second end of the blade at an angle to allow the probe member to contact the common ground member.

12. The blade probe card as recited in claim 1, wherein each blade from the plurality of blades has a surface that includes:
a first conductive signal trace formed on the surface and that electrically connects the probe member to a contact on the printed circuit board, and
two or more conductive ground traces formed on the surface and that are adjacent to and substantially surround the first conductive signal trace to reduce crosstalk between the plurality of blades.

13. The blade probe card as recited in claim 1, wherein the two or more conductive ground traces are substantially parallel to the first conductive signal trace.

14. The blade probe card as recited in claim 1, wherein:
the plurality of blades is a plurality of ceramic blades, and
the first conductive signal trace is a metallic signal trace and the two or more conductive ground traces are two or more metallic ground traces.

15. A blade probe card comprising:
a plurality of blades, wherein each blade from the plurality of blades has a surface that includes:
a first conductive signal trace formed on the surface and that electrically connects the probe member to a contact on the printed circuit board, and
two or more conductive ground traces formed on the surface and that are adjacent to and substantially surround the first conductive signal trace to reduce crosstalk between the plurality of blades.

16. The blade probe card as recited in claim 15, wherein:
each blade from the plurality of blades further includes:
a first end connected to a printed circuit board,
a second end,
a probe member attached to the second end and extending therefrom, wherein
the probe member is configured to make contact with a device under test, and
a ground member attached to the second end and extending therefrom; and
the blade probe card further includes a common ground member that is separate from the printed circuit board and coupled to the ground member of each blade from the plurality of blades.

17. The blade probe card as recited in claim 15, wherein:
the plurality of blades is a plurality of ceramic blades, and
the first conductive signal trace is a metallic signal trace and the two or more conductive ground traces are two or more metallic ground traces.

* * * * *